United States Patent
Ying et al.

(10) Patent No.: US 11,672,185 B2
(45) Date of Patent: Jun. 6, 2023

(54) MAGNETIC DEVICE AND MAGNETIC RANDOM ACCESS MEMORY

(71) Applicant: TAIWAN SEMICONDUCTOR MANUFACTURING COMPANY, LTD., Hsinchu (TW)

(72) Inventors: Ji-Feng Ying, Hsinchu (TW); Jhong-Sheng Wang, Taichung (TW); Tsann Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 26 days.

(21) Appl. No.: 17/516,469

(22) Filed: Nov. 1, 2021

(65) Prior Publication Data
US 2022/0052254 A1  Feb. 17, 2022

Related U.S. Application Data

(62) Division of application No. 16/592,007, filed on Oct. 3, 2019, now Pat. No. 11,165,012.
(Continued)

(51) Int. Cl.
*G11C 7/00* (2006.01)
*H01L 43/02* (2006.01)
(Continued)

(52) U.S. Cl.
CPC ............ *H01L 43/02* (2013.01); *G11C 11/161* (2013.01); *G11C 11/1655* (2013.01);
(Continued)

(58) Field of Classification Search
CPC ............. G11C 11/161; G11C 11/1655; G11C 11/1657; G11C 11/1659; G11C 11/1675;
(Continued)

(56) References Cited

U.S. PATENT DOCUMENTS 8,416,600 B2  4/2013 Lin et al.
9,734,880 B1  8/2017 Augustine et al.
(Continued)

FOREIGN PATENT DOCUMENTS

CN  102881820 A  1/2013
CN  104393169 A  3/2015
(Continued)

OTHER PUBLICATIONS

Non-Final Office Action issued in U.S. Appl. No. 16/592,007, dated Mar. 4, 2021.
(Continued)

*Primary Examiner* — Hien N Nguyen
(74) *Attorney, Agent, or Firm* — McDermott Will & Emery LLP

(57) ABSTRACT

A magnetic memory includes a first spin-orbital-transfer-spin-torque-transfer (SOT-STT) hybrid magnetic device disposed over a substrate, a second SOT-STT hybrid magnetic device disposed over the substrate, and a SOT conductive layer connected to the first and second SOT-STT hybrid magnetic devices. Each of the first and second SOT-STT hybrid magnetic devices includes a first magnetic layer, as a magnetic free layer, a spacer layer disposed under the first magnetic layer, and a second magnetic layer, as a magnetic reference layer, disposed under the spacer layer. The SOT conductive layer is disposed over the first magnetic layer of each of the first and second SOT-STT hybrid magnetic devices.

20 Claims, 10 Drawing Sheets

Related U.S. Application Data

(60) Provisional application No. 62/752,274, filed on Oct. 29, 2018.

(51) Int. Cl.
*H01L 43/10* (2006.01)
*H01L 43/12* (2006.01)
*H01F 10/32* (2006.01)
*G11C 11/16* (2006.01)
*H01L 27/22* (2006.01)
*H01L 43/04* (2006.01)

(52) U.S. Cl.
CPC ...... *G11C 11/1657* (2013.01); *G11C 11/1659* (2013.01); *G11C 11/1675* (2013.01); *H01F 10/329* (2013.01); *H01F 10/3254* (2013.01); *H01L 27/228* (2013.01); *H01L 43/10* (2013.01); *H01L 43/12* (2013.01); *H01L 43/04* (2013.01)

(58) Field of Classification Search
CPC ... G11C 11/1693; G11C 11/18; G11C 11/165; H01L 43/02–12; H01L 27/222
See application file for complete search history.

(56) References Cited

U.S. PATENT DOCUMENTS

| | | | |
|---|---|---|---|
| 11,289,143 B2* | 3/2022 | Song | G11C 11/161 |
| 2008/0219043 A1 | 9/2008 | Yoon et al. | |
| 2010/0110757 A1 | 5/2010 | Ma et al. | |
| 2013/0148418 A1 | 6/2013 | Luo et al. | |
| 2017/0117323 A1 | 4/2017 | Braganca et al. | |
| 2017/0221541 A1 | 8/2017 | Jo et al. | |
| 2018/0123031 A1 | 5/2018 | Adelmann et al. | |
| 2018/0151210 A1 | 5/2018 | Li et al. | |
| 2018/0190899 A1 | 7/2018 | Kim et al. | |
| 2018/0233188 A1 | 8/2018 | Sayed et al. | |
| 2021/0134339 A1* | 5/2021 | Song | H01L 27/228 |
| 2021/0202827 A1* | 7/2021 | Song | H01L 43/02 |
| 2021/0367143 A1* | 11/2021 | Lee | H01F 41/302 |

FOREIGN PATENT DOCUMENTS

| | | |
|---|---|---|
| CN | 106158000 A | 11/2016 |
| CN | 108292702 A | 7/2018 |
| CN | 104051610 B | 10/2018 |
| JP | 2009-054698 A | 3/2009 |
| JP | 2017-112358 A | 6/2017 |
| KR | 10-2008-0070812 A | 7/2008 |
| KR | 10-2016-0022809 A | 3/2016 |
| KR | 10-2016-0134598 A | 11/2016 |
| KR | 10-2017-0092015 A | 8/2017 |
| TW | I590242 B | 7/2017 |
| WO | 2007/035786 A2 | 3/2007 |
| WO | 2014/204492 A1 | 12/2014 |

OTHER PUBLICATIONS

Notice of Allowance issued in U.S. Appl. No. 16/592,007, dated Jun. 28, 2021.

* cited by examiner

MAGNETIC DEVICE AND MAGNETIC RANDOM ACCESS MEMORY

RELATED APPLICATIONS

This application is a division of U.S. patent application Ser. No. 16/592,007 filed Oct. 3, 2019, now U.S. Pat. No. 11,165,012, which claims priority to U.S. Provisional Patent Application No. 62/752,274 filed Oct. 29, 2018, the entire contents of each of which are incorporated herein by reference.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque random access memory (STT-RAM). An STT-RAM utilizes a magnetic tunneling junction (MTJ) written at least in part by a current driven through the MTJ. Another type of an MRAM is a spin orbit torque RAM (SOT-RAM).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
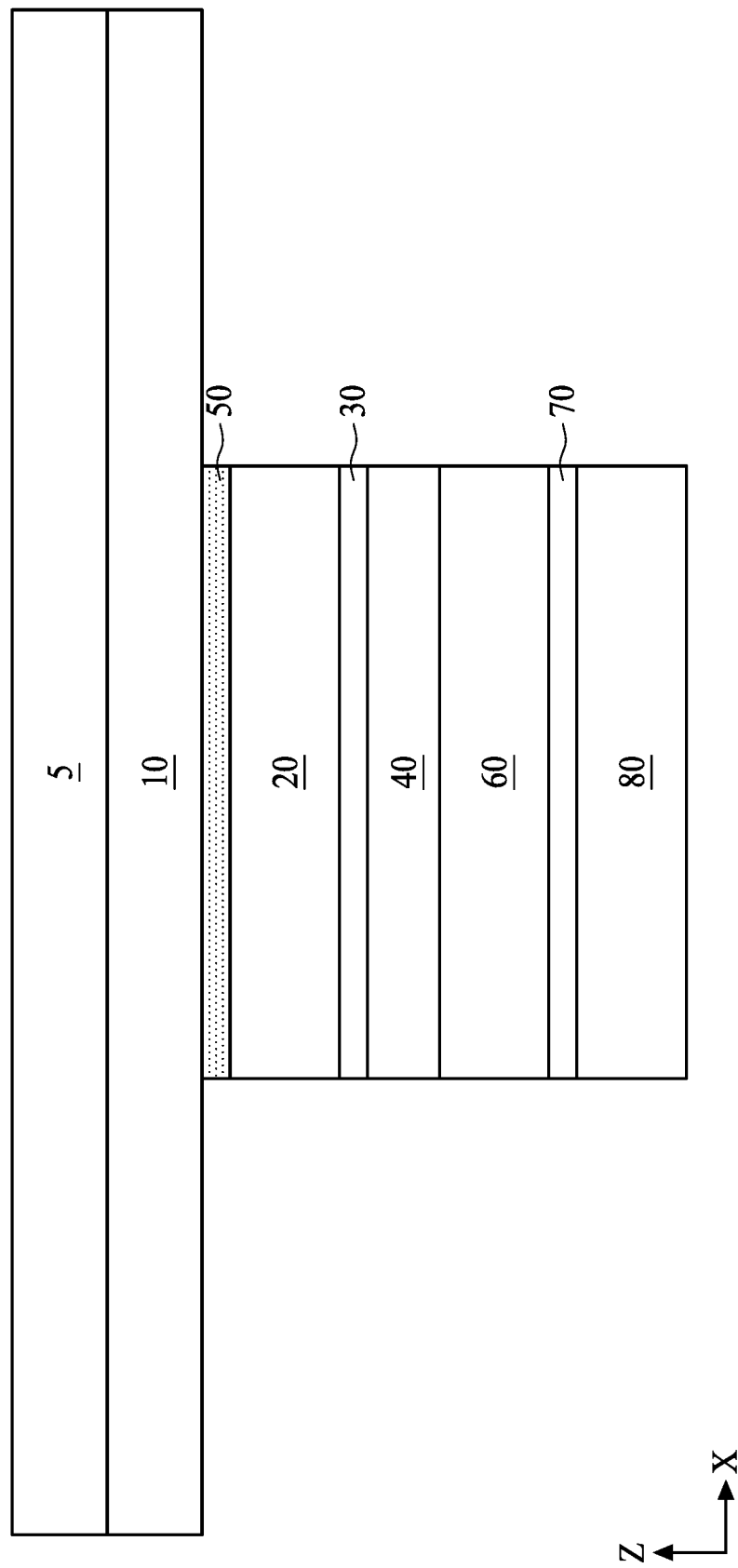
FIG. 1 is a schematic view of an SOT-STT hybrid MRAM cell according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

A spin-torque-transfer magnetic random access memory (STT MRAM), is one of the next generation technologies for CMOS integrated circuits (ICs) that require a memory, due to its non-volatile nature, compatibility with Si-CMOS technology, fast read and write speed, high data endurance and retention, a relative small bit-cell size as well as environmental robustness. A high-value emerging application for a STT MRAM is a low-level cache for a central processing unit (CPU) or a micro control unit (MCU), which offers the attractive benefit of system speed boost and faster turn-on due its non-volatility. However, this application puts a strenuous requirement on the memory's speed, more specifically on write speed which is much slower than read speed. The cache application for a CPU and/or an MCU additionally requires low-power consumption, which is hard for a STT MRAM, because it takes substantial current to change the magnetization state during write operation. In current STT MRAM art, write speed improvement via a film stack and write scheme optimization and write current reduction via stack optimization and critical dimension (CD) reduction may be stalled due to inevitable performance trade-off in endurance and retention. Novel ideas, like a high frequency-assisted write operation, have been proposed, which may not be feasible. There is a significant gap between the best reported STT MRAM write speed and current and those required by cache applications, which could amount to a show stopper.

In contrast, spin-orbital-transfer (or spin-orbital-torque) (SOT) magnetic switching is an emerging write concept that has the potential to provide order-of-magnitude improvement on write current and speed. SOT is considered as a solution for high-speed, low power cache application.

Figure 10:
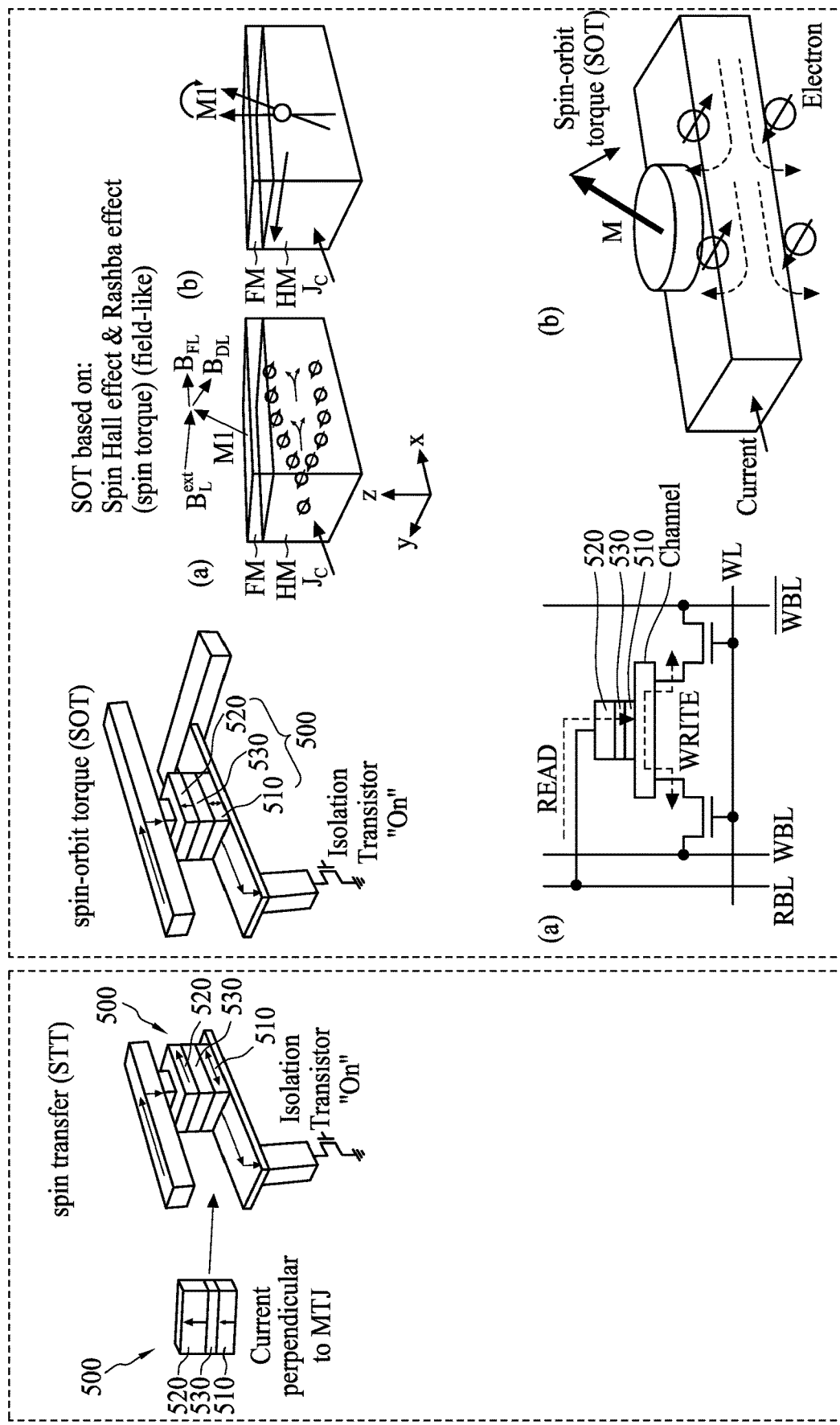
FIG. 10 shows operations of an STT MRAM and an SOT MRAM.

FIG. 10 shows operations of an STT MRAM and an SOT MRAM.

An STT-MRAM cell includes a magnetic tunnel junction (MTJ) film stack 500 having a free magnetic layer 510 (FL), a reference or pinned magnetic layer 520 (RL) and a tunnel barrier layer 530. The magnetization of the magnetic layers can be either in-plane or perpendicular to the plane. The FL 510 is the magnetic layer which has two energetically equivalent magnetic states, with the magnetization in the FL 510 parallel or antiparallel to the magnetization of the RL 520. By applying a current perpendicular to the MTJ film stack 500, the magnetic orientation (moment) of the free magnetic layer can be changed, thereby writing data to the STT-MRAM cell.

In contrast, in an SOT-MRAM, the magnetic moment of the free magnetic layer is switched using the spin-orbit interaction effect caused by a current flowing parallel to the MTJ film stack 500. The magnetic moment of the free magnetic layer is switched using only the spin-orbit interaction effect, or the magnetic moment of the free magnetic layer is switched using a combination of effects.

However, an SOT device structure have various issues. For example, since the SOT device writes data with a SOT current plus as an assisting magnetic field, a design-in magnetic field is undesirable for manufacturing cost and device scaling. In addition, an SOT design does not have a hard bias layer, which results in insufficient data retention and endurance properties. Further, since an SOT layer (a heavy metal wire) is generally located below the magnetic-tunneling-junction (MTJ) stack, a possible hard bias layer for the MTJ film stack can only be on top of the MTJ film stack (top-pin), and such a top-pin design may result in a poor performance. Moreover, a SOT current line below the MTJ film stack can only be realized with a 2T1R (two transistors-one resistor) structure, which results in a large cell footprint.

In the present disclosure, an implementable SOT-triggered STT MRAM design is proposed, which can realize SOT's high write speed and low power advantage plus STT's data endurance and retention, has no need for an additional magnetic field, has a 1T1R (one transistor-on resistor) structure with a small cell footprint, has a shared SOT current line which allows a page writing operation, has a SOT layer located above the MTJ film stack, which allows the proven bottom-pin STT design, and has a SOT and STT efficient film stack design.

FIG. 1 is a schematic view of a SOT-STT hybrid MRAM cell according to an embodiment of the present disclosure.

The SOT-STT hybrid magnetic device includes a SOT induction wiring layer 10, as a spin-orbit interaction active layer, formed over a MTJ film stack. The MTJ film stack includes a first magnetic layer 20, which is a free magnetic layer or a data storage layer, disposed under the SOT induction wiring layer 10, a nonmagnetic spacer layer 30 disposed under the first magnetic layer 20, and a second magnetic layer 40, as a reference layer, disposed under the nonmagnetic spacer layer 30. In some embodiments, an interface layer 50, as a keeper layer, is disclosed between the SOT induction wiring layer 10 and the first magnetic layer 20. Further, the MTJ film stack includes a third magnetic layer 60, as a hard bias layer, disposed under the second magnetic layer 40, and a bottom electrode layer 80. In some embodiments, a seed layer 70 is formed on the bottom electrode layer 80. In some embodiments, an antiferromagnetic layer, for example a Ru layer, is disposed between the second magnetic layer 40 and the third magnetic layer 60. Further, in some embodiments, a top conductive layer 5, e.g., a top electrode, is disposed on the SOT induction wiring layer 10.

The magnetic moment of the free layer 20 (first magnetic layer) is switched using the spin-orbit interaction effect. In some embodiments, the magnetic moment of the first magnetic layer 20 is switched using only the spin-orbit interaction effect. In other embodiments, the magnetic moment of the first magnetic layer 20 is switched using a combination of effects. For example, the magnetic moment of the first magnetic layer 20 is switched using spin transfer torque as a primary effect that may be assisted by torque induced by the spin-orbit interaction. In other embodiments, the primary switching mechanism is torque induced by the spin-orbit interaction. In such embodiments, another effect including, but not limited to, spin transfer torque, may assist in switching.

The SOT induction wiring layer 10 is a spin orbit active layer that has a strong spin-orbit interaction and that can be used in switching the magnetic moment of the first magnetic layer 20. The SOT induction wiring layer 10 is used in generating a spin-orbit magnetic field H. More specifically, a current driven in a plane through the SOT induction wiring layer 10 and the attendant spin-orbit interaction may result in the spin-orbit magnetic field H. This spin orbit magnetic field H is equivalent to the spin-orbit torque T on magnetization, where $T=-\gamma[M \times H]$ in the first magnetic layer 20. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for a current driven in a plane in the SOT induction wiring layer 10 and a spin-orbit interaction. In contrast, spin transfer torque is due to a perpendicular-to-plane current flowing through the first magnetic layer 20, the nonmagnetic spacer layer 30 and the second magnetic layer 40 (reference layer), that injects spin polarized charge carriers into the first magnetic layer 20. The spin-orbit torque T may rapidly deflect the magnetic moment of the first magnetic layer 20 from its equilibrium state parallel to the easy axis. The spin-orbit torque T may tilt the magnetization of the first magnetic layer 20 considerably faster than conventional STT torque of a similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the first magnetic layer 20.

In some embodiments, the interaction of the SOT induction wiring layer includes the spin Hall effect. For the spin Hall effect, a current Je is driven in the plane of the SOT induction wiring layer 10 (i.e., current-in-plane, substantially in the x-y plane in FIG. 1). In other words, the current Je is driven perpendicular to the stacked direction of the films including the SOT induction wiring layer 10 and the first magnetic layer 20 (i.e., perpendicular to the normal to the surface, the z-direction in FIG. 1). Charge carriers having spins of a particular orientation perpendicular to the direction of current and to the normal to the surface (z-direction) accumulate at the surfaces of the SOT induction wiring layer 10. A majority of these spin-polarized carriers diffuse into the first magnetic layer 20 (free layer). This diffusion results in the torque T on the magnetization of the first magnetic layer 20. Since torque on the magnetization is equivalent to the effective magnetic field on the magnetization, as set forth above, the spin accumulation equivalently results in the field H on the first magnetic layer 20. The spin-orbit field for the spin-Hall effect is the cross product of the spin-orbit polarization and the magnetic moment of the first magnetic layer 20. As such, the magnitude of the torque is proportional to the in-plane current density Je and spin polarization of the carriers. The spin-Hall effect may be used in switching the magnetic stacked layer shown in FIG. 1 when the polarization induced by the spin-Hall effect is parallel to the easy axis of the first magnetic layer 20. To obtain the spin-orbit torque T, the current pulse is driven in plane through the SOT induction wiring layer 10. The resulting spin-orbit torque T counteracts damping torque, which results in the switching of the magnetization of the first magnetic layer 20 in an analogous manner to conventional STT switching.

As set forth above, the SOT induction wiring layer 10 is a spin orbit active layer that causes a strong spin orbit interaction with the first magnetic layer 20 (free layer). In some embodiments, the SOT induction wiring layer 10 includes one or more heavy metals or materials doped by heavy metals. In certain embodiments, α-W, β-W, Mo, Ru and/or β-Ta is used as the SOT induction wiring layer 10. A thickness of the SOT induction wiring layer 10 is in a range from about 2 nm to 20 nm in some embodiments and is in a range from about 5 nm to 15 nm in other embodiments. In some embodiments, an antiferromagnetic layer made of, for example, IrMn, is disposed between the SOT induction wiring layer 10 and the top conductive layer 5. In other embodiments, instead of the heavy metal layer, the antiferromagnetic layer (e.g., IrMn) is used as the SOT induction wiring layer 10.

The first magnetic layer 20 as a data storage layer is a free layer having a magnetic moment that is switchable. In some embodiments, the first magnetic layer 20 is a cobalt iron boron (CoFeB) layer, a cobalt/palladium (CoPd) layer and/or a cobalt iron (CoFe) layer, having a thickness in a range from about 0.6 nm to about 1.2 nm in some embodiments. In certain embodiments, the first magnetic layer 20 is $Fe_xCo_yB_{1-x-y}$, where $0.50 \leq x \leq 0.70$ and $0.10 \leq y \leq 0.30$. In other embodiments, $0.55 \leq x \leq 0.65$ and $0.15 \leq y \leq 0.25$.

The nonmagnetic spacer layer 30 is made of a dielectric material, and functions as a tunneling barrier. In some embodiments, the nonmagnetic spacer layer 30 includes a crystalline or an amorphous magnesium oxide (MgO) layer. In other embodiments, the nonmagnetic spacer layer 30 is made of aluminum oxide or a conductive material, such as Cu. In some embodiments, the nonmagnetic spacer layer 30 has a thickness in a range from about 0.3 nm to about 1.2 nm, and in other embodiments, the thickness of the nonmagnetic layer 30 is in a range from about 0.5 nm to about 1.0 nm. In this disclosure, an "element layer" or a "compound layer" generally means that the content of the element or compound is more than 99%.

The second magnetic layer 40 is a reference layer of which the magnetic moment does not change. In some embodiments, the second magnetic layer 40 is made of the same material as the first magnetic layer 20 as set forth above. In some embodiments, the second magnetic layer 40 includes one or more layers of magnetic materials. In some embodiments, the second magnetic layer 40 includes a layer of cobalt (Co), iron (Fe) and boron (B) or includes a layer of Fe and B. In some embodiments, a thickness of the second magnetic layer 40 is in a range from about 0.2 nm to about 1.0 nm and is in a range from about 0.3 nm to about 0.5 nm in other embodiments.

The third magnetic layer 60 is a hard bias layer of which magnetic moment does not change. In some embodiments, the third magnetic layer 60 includes a multilayer structure of cobalt (Co) and platinum (Pt). In some embodiments, a thickness of the third magnetic layer 60 is in a range from about 0.2 nm to about 2.0 nm and is in a range from about 0.3 nm to about 1.0 nm in other embodiments.

In some embodiments, a seed layer 70 includes Ta. In some embodiments, the bottom electrode layer 80 includes Ti, TiN, Ta and/or TaN. In some embodiments, a CoHf buffer layer is disposed between the third magnetic layer 60 and the bottom electrode layer 80.

The top conductive layer 5 is an electrode that includes one or more layers of Ta, TiN, TaN, Ru, Au, and Al.

The interface layer 50 includes at least one of an MgO layer and a Co layer in some embodiments. The interface layer 50 can minimize the magnetic interference between the first magnetic layer 20 and the SOT induction wiring layer 10, while maintaining magnetic coupling thereof.

Figure 2:
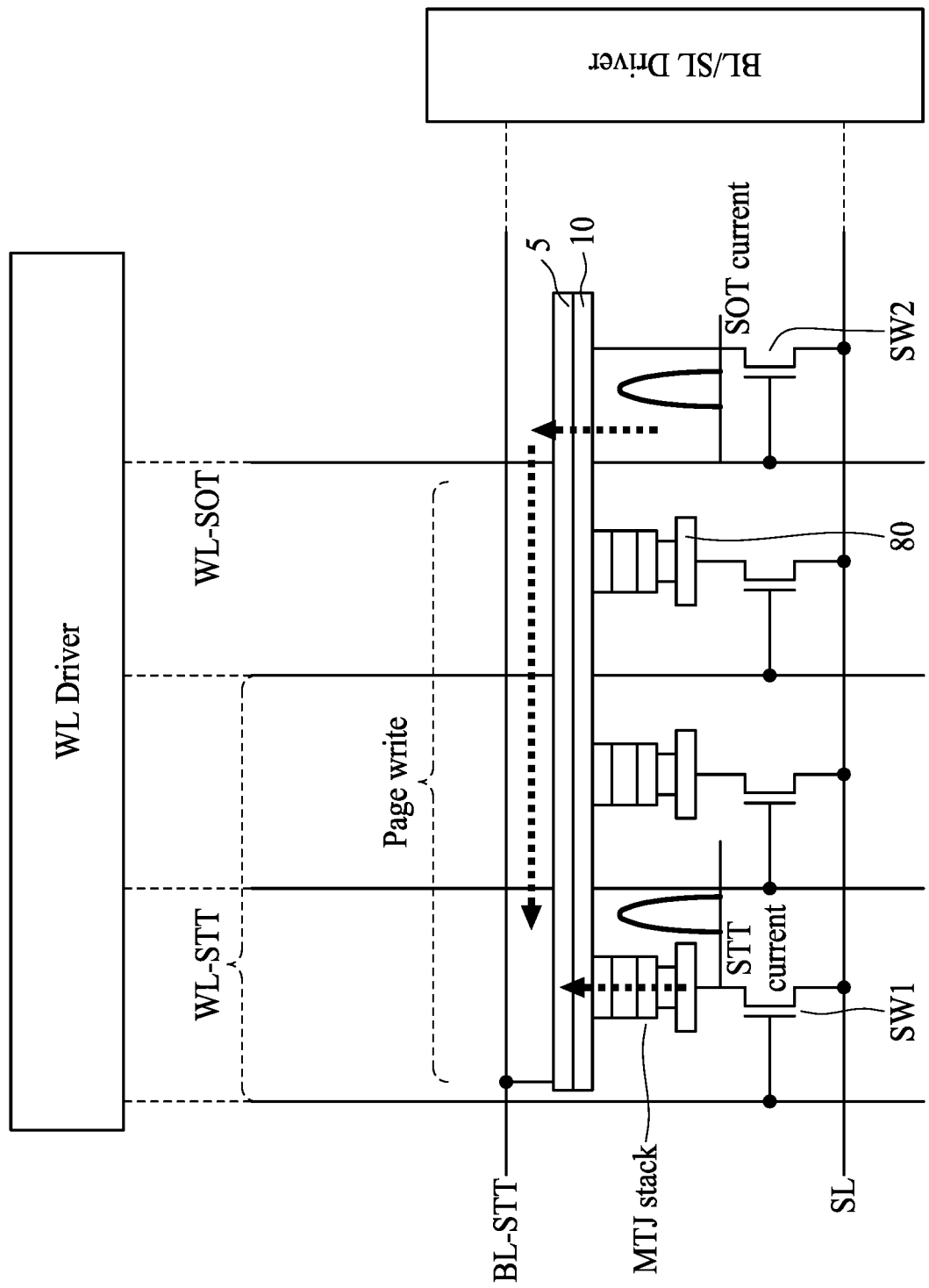
FIG. 2 shows a circuit diagram of an SOT-STT hybrid MRAM device according to an embodiment of the present disclosure.

FIG. 2 shows a circuit diagram of an SOT-STT hybrid MRAM device according to an embodiment of the present disclosure.

In some embodiments of the present disclosure, multiple MTJ stacks are coupled to one SOT induction wiring layer 10, as shown in FIG. 2. In other words, multiple MTJ stacks share the SOT induction wiring layer 10. As shown in FIG. 2, the bottom electrode layer 80 of each of the MTJ stacks is coupled to a switching device SW1, such as a MOS FET. In some embodiments, a drain of the MOS FET is coupled to the bottom electrode layer 80 and a source of the MOS FET is coupled to a source line SL, which is coupled to a source line driver circuit including a current source. A gate of the MOS FET is coupled to a STT word line WL-STT. Further, one end of the SOT induction wiring layer 10 together with the top conductive layer 5 is coupled to a bit line BL-STT. In addition, another switching device SW2 (an SOT switching device), such as a MOS FET, is disposed between the other end of the SOT induction wiring layer 10 and the source line SL. In some embodiments, a drain of the SOT switching MOS FET SW2 is coupled to the SOT induction wiring layer 10 and a source of the SOT switching MOS SW2 FET is coupled to the source line SL. A gate of the SOT switching MOS FET SW2 is coupled to a SOT word line WL-SOT. The word lines WL-STT and WL-SOT are coupled to a word line driver circuit in some embodiments. The bit line BL-STT is coupled to a bit line driver in some embodiments.

In the configuration of FIG. 2, in a SOT-triggered STT MRAM design, data is written to the MTJ film stack by passing an in-plane SOT current by turning on the SOT switching MOS FET SW2 through the SOT induction wiring layer 10 adjacent to the first magnetic layer (free magnetic layer) 20 disposed on top of the MTJ film stack, and passing a vertical STT current by turning on the MOS FET SW1 through the MTJ film stack, simultaneously. Thus, the SOT-triggered STT MRAM can write data without an assisting magnetic field. Further, since multiple MTJ film stacks share the same SOT induction wiring layer 10, it is possible to perform a page writing. As shown in FIG. 2, the circuit structure is a 1T1R structure with a small cell footprint.

Figure 3:
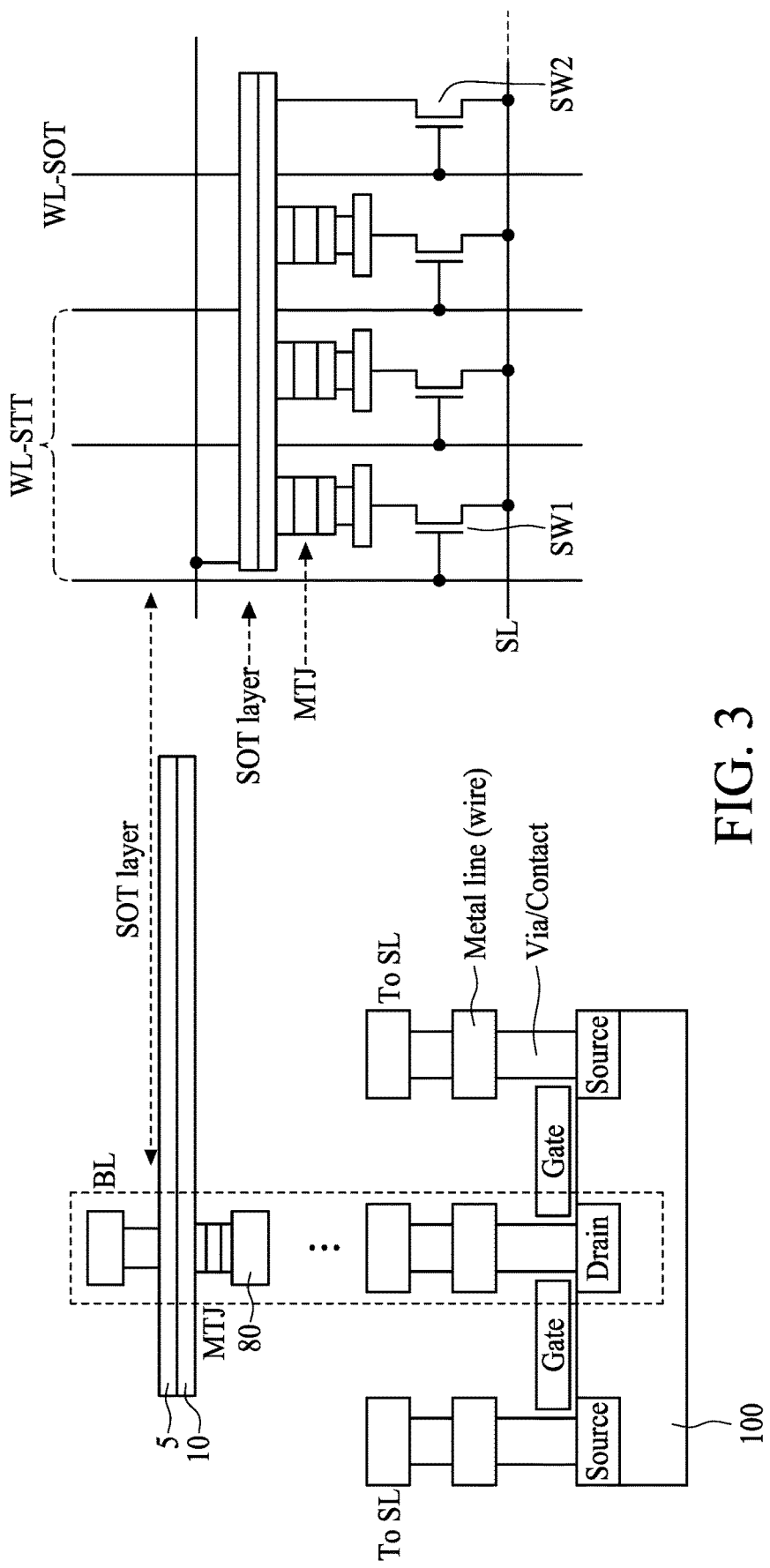
FIG. 3 shows a circuit diagram of an SOT-STT hybrid MRAM device according to an embodiment of the present disclosure.
Figure 4:
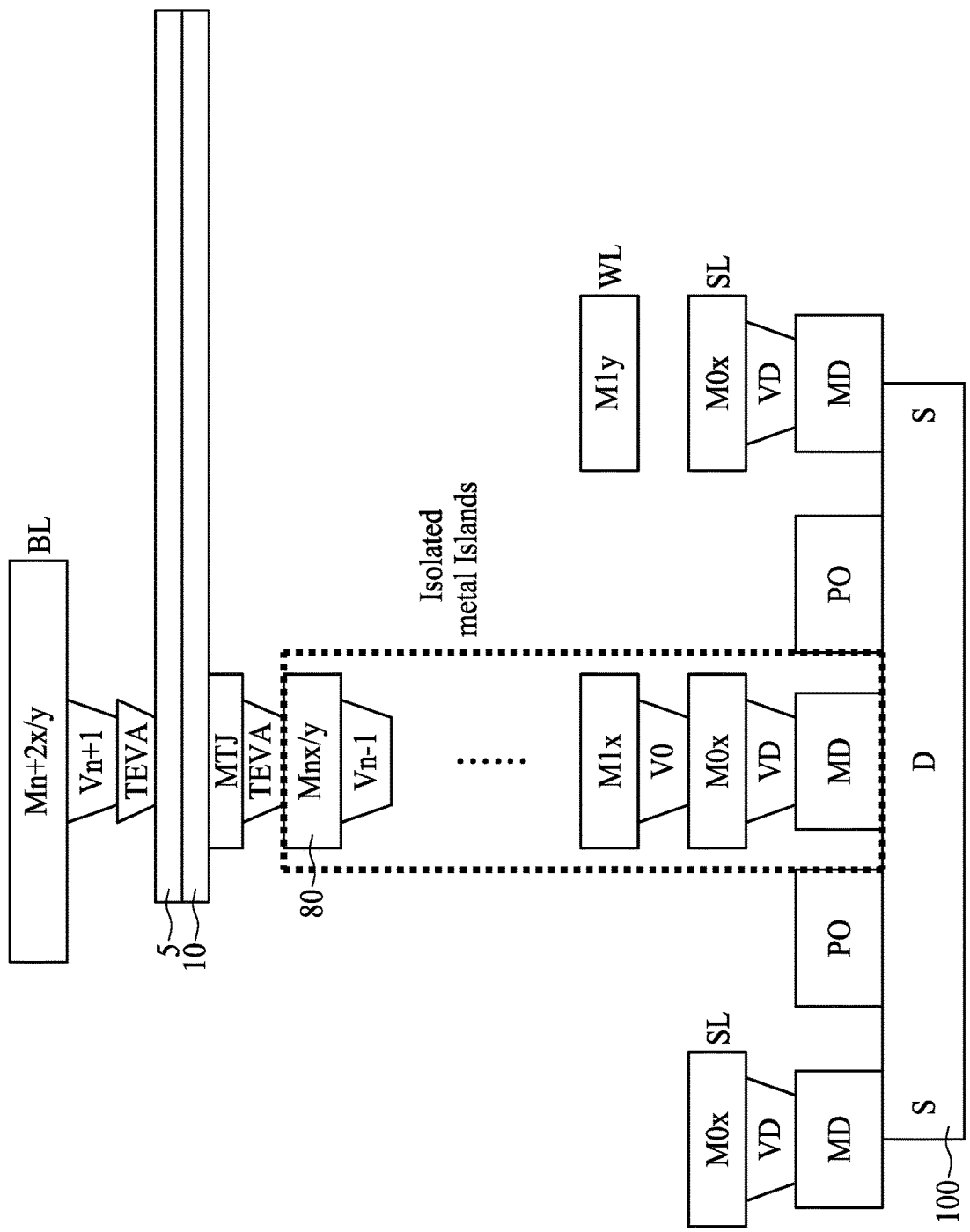
FIG. 4 is a schematic view of an SOT-STT hybrid MRAM cell according to an embodiment of the present disclosure.

FIG. 3 shows a circuit diagram of an SOT-STT hybrid MRAM device according to an embodiment of the present disclosure. FIG. 4 is a schematic view of an SOT-STT hybrid MRAM cell according to an embodiment of the present disclosure.

As shown in FIGS. 3 and 4, the switching devices (MOS FETs) SW1 and SW2 are located below the MTJ film stacks.

In some embodiments, the MOS FETs are formed on a substrate 100. In some embodiments, the substrate 100 includes a single crystalline semiconductor layer on at least it surface portion. The substrate 100 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si.

Each of the MOS FETs includes a gate, a source and a drain, and one of the source and the drain is electrically coupled to the bottom electrode 80 of the MTJ film stack via one or more contacts and metal wirings, and the other one of the source and the drain is electrically coupled to the source line SL via one or more contacts and metal wirings. In some embodiments, the MOS FETs are planar MOS FETs, fin FETs (Fin FETs) and/or gate-all-around FETs (GAA FETs).

In some embodiments, as shown in FIG. 4, the bottom electrode layer 80 is coupled to an n-th metal layer or is formed by the n-th metal layer, where n is 0, 1, 2, . . . 10, or more. The top conductive layer 5 is coupled to an (n+2)-th metal wiring Mn+2x/y, which constitutes the bit line BL, via a (n+1)-th via contact Vn+1. In this embodiment, the SOT induction wiring layer 10 and the top conductive layer 5 are considered as a (n+1)-th metal layer. In some embodiments, n is 4, 5, 6, 7, 8, 9 or 10. In some embodiments, the top conductive layer 5 and the SOT induction wiring layer 10 are located at the Mn+1 metal wiring level.

In some embodiments, as shown in FIG. 4, a source of a MOS FET is coupled to a source line SL disposed on the 0-th metal wiring layer M0x extending to the X direction via a source/drain contact structure MD and VD. A drain of a MOS FET is coupled to the bottom electrode 80, which is the n-th wiring Mnx/y extending in either one of the X or Y directions, via a source/drain contact structure MD and VD, a 0-th (V0) to an (n−1)-th (Vn−1) via contacts and a 0-th (M0x) to an (n−1)-th metal wirings, in some embodiments. In some embodiments, odd number metal wirings (M1y, . . . ) extend in the Y direction and even number metal wirings (M0x, . . . ) extend in the X direction crossing the Y direction. In some embodiments, the word line WL is disposed in the first metal wiring layer M1y. In some embodiments, a top electrode via TEVA is disposed between the top conductive layer 5 and the (n+1)-th via contact Vn+1, and a bottom electrode via BEVA are disposed between the MTJ film stack MTJ and the bottom electrode 80 (Mnx/y).

Figure 5:
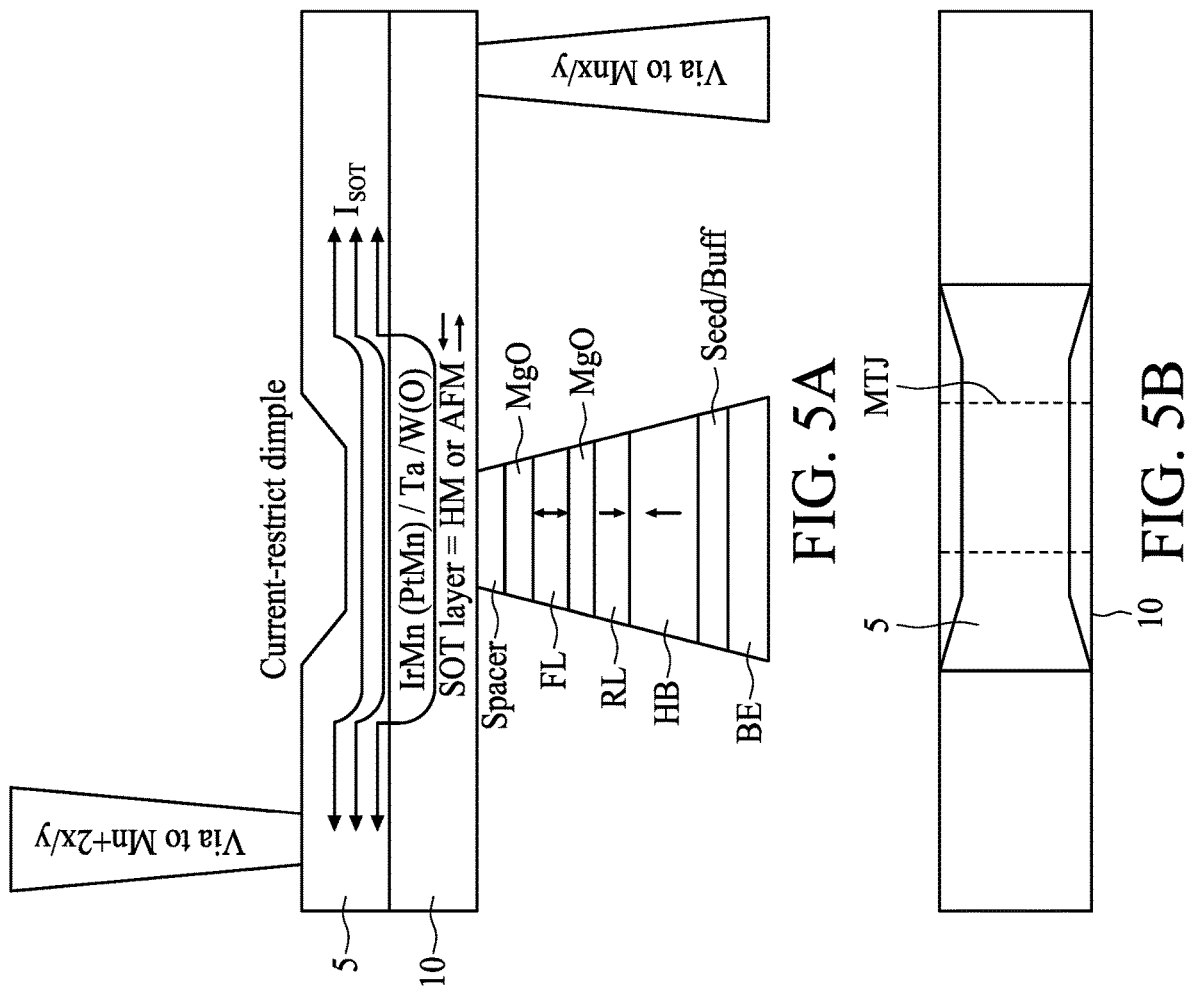
FIG. 5A is a cross sectional view of one cell of an SOT-STT hybrid MRAM device according to an embodiment of the present disclosure.
FIG. 5B is a plan view of one cell of an SOT-STT hybrid MRAM device according to an embodiment of the present disclosure.

FIG. 5A is a cross sectional view of one cell of an SOT-STT hybrid MRAM device according to an embodiment of the present disclosure.

In some embodiments, the top conductive layer 5 has a dimple (thin portion) above the MTJ film stack, where a thickness of the top conductive layer 5 is smaller than the remaining portion of the top conductive layer 5. This structure allows an increase in current flowing through the SOT induction wiring layer 10 to cause a sufficient SOT effect, while allowing a low resistance between adjacent cells. In some embodiments, a thickness of the top conductive layer 5 is in a range from about 2 nm to 20 nm in some embodiments and is in a range from about 5 nm to 15 nm in other embodiments, and the thickness of the thin portion of the top conductive layer 5 is about 40% to about 80% of the thickness of the top conductive layer 5 at other than the thin portion.

FIG. 5B is a plan view of one cell of an SOT-STT hybrid MRAM device according to an embodiment of the present disclosure. In other embodiments, in addition to or instead of the dimple, a narrow portion, at which the width of the top conductive layer 5 is narrower above the MTJ film than the remaining portion of the top conductive layer 5, is provided. The width of the narrow portion of the top conductive layer 5 is about 50% to about 90% of the width of the top conductive layer 5 at other than the narrow portion.

Figure 6:
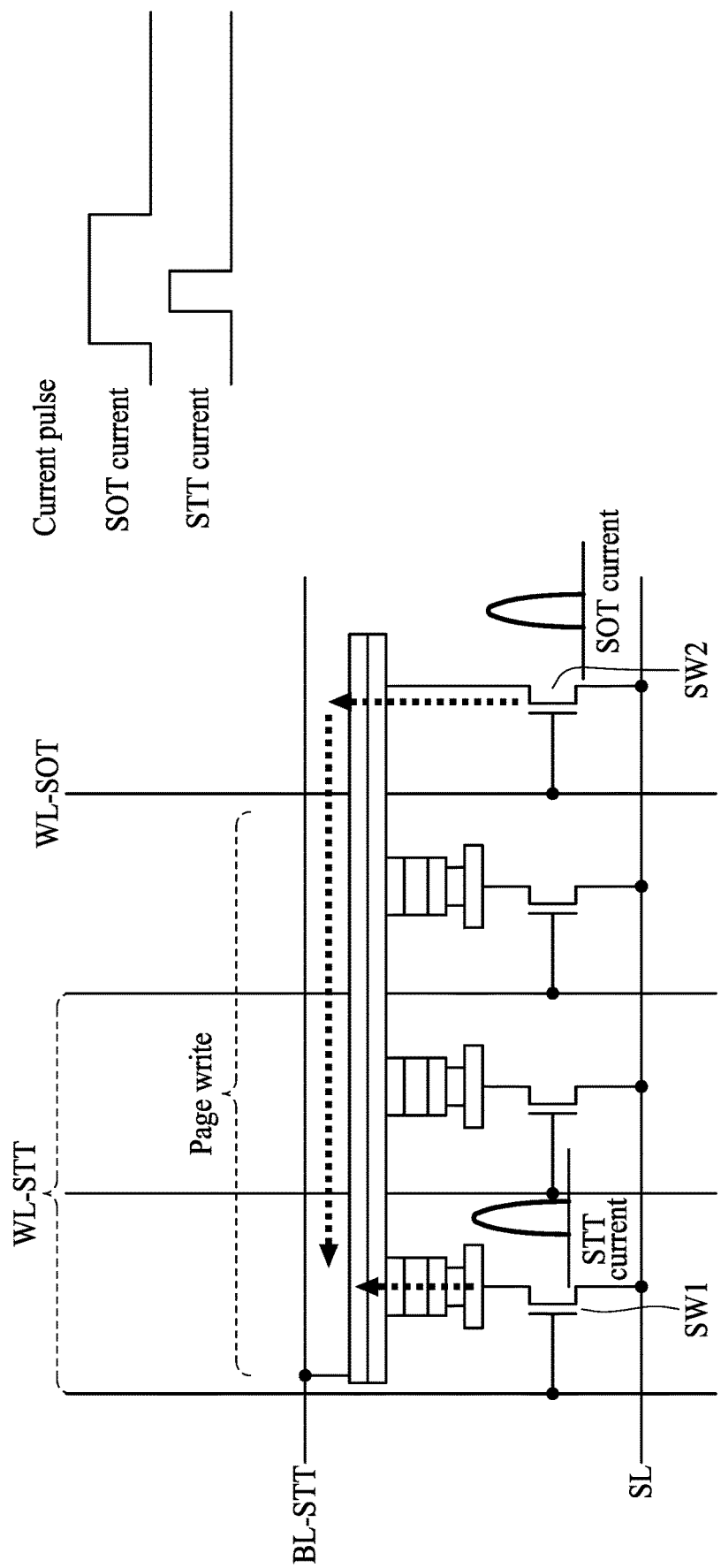
FIG. 6 shows an operation of writing data to an SOT-STT hybrid MRAM cell according to an embodiment of the present disclosure.

FIG. 6 shows an operation of writing data to an SOT-STT hybrid MRAM cell according to an embodiment of the present disclosure.

In some embodiments, a SOT current is applied to the SOT induction wiring layer 10 (and the top conductive layer 5) by turning on the SOT switching device SW2, and thereafter, a STT current is applied to one of the cells by turning on the STT switching device SW1 coupled to the one of the cells, thereby writing data to the one of the cells, by operations of the word line drive, the bit line driver and/or the source line driver. Further, the STT switching device coupled to the one of the cells is turned off, and thereafter, the SOT switching device is turned off, by operations of the word line drive, the bit line driver and/or the source line driver.

In some embodiments, the SOT current and the STT current are pulse currents as shown in FIG. 6. The amplitude of SOT current is in a range of about $1 \times 10^{-7}$ to about $1 \times 10^{-6}$ $A/cm^2$ and a pulse duration is in a range from about 1 ns to about 20 ns, in some embodiments. The amplitude of the STT current is greater than that of the SOT current and is in a range from about $1 \times 10^{-6}$ to about $1 \times 10^{-5}$ $A/cm^2$, and a pulse duration is in a range from about 500 ps to about 10 ns, in some embodiments. In a case of a pure STT device, the writing current is about $1 \times 10^{-5}$ $A/cm^2$ for a duration of 50 ns to 500 ns, and in a case of a pure SOT device, the writing current is about $1 \times 10^{-6}$ $A/cm^2$ for a duration of 100 ps to 10 ns. Accordingly, in the SOT-STT hybrid MRAM cell according to the embodiments of the present disclosure, a lower operation current (i.e., lower power consumption) and a higher writing speed can be obtained. Further, by turning on multiple switches SW1, a page wiring operation is possible.

Figure 7:
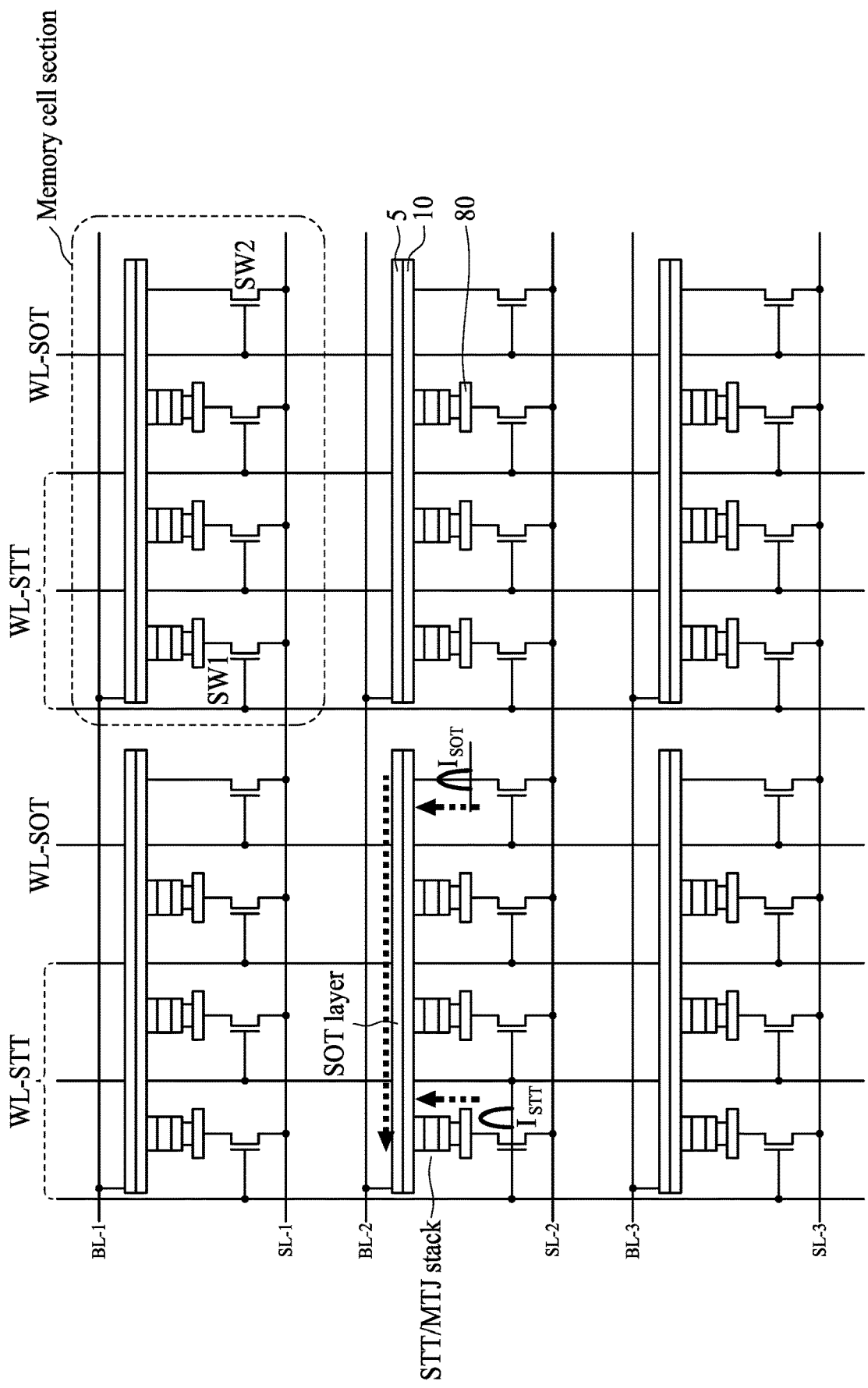
FIG. 7 shows a memory array structure of an SOT-STT hybrid MRAM device according to embodiments of the present disclosure.

FIG. 7 shows a memory array structure according to embodiments of the present disclosure. The memory array includes a matrix of a plurality of memory cell sections, and each of the memory cell sections includes 2 to 32 memory cells coupled to one SOT induction wiring layer 10 and one SOT switching device. Each of the SOT induction wirings is coupled to a corresponding bit line, BL-1, BL-2 or BL-3. Each of the switching devices SW1 is coupled to a corresponding source lines SL-1, SL-2 or SL-3. In some embodiments, each of the memory cell sections includes 2, 4, 8, 16, 32, 64 or 128 memory cells. In some embodiments, each of the memory cell sections includes one or more redundant memory cells, which may be replaced with one or more defective memory cells. In some embodiments, each of the memory cell sections includes one or more dummy memory cells.

FIGS. 8A-8K shows a sequential manufacturing operation for a hybrid SOT MRAM according to the present disclosure. It is understood that in the sequential manufacturing process, one or more additional operations can be provided before, during, and after the stages shown in FIGS. 8A-8K, and some of the operations described below can be replaced or eliminated for additional embodiments of the method.

The order of the operations/processes may be interchangeable. Materials, configurations, dimensions, processes and/or operations described with respect to FIGS. 1-7 may be employed in the following embodiments, and detailed explanation thereof may be omitted.

Figure 8A:
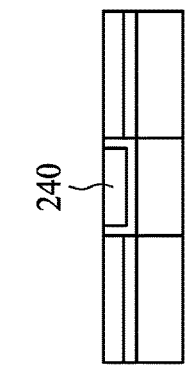
FIGS. 8A, 8B, 8C, 8D, 8E, 8F, 8G, 8H, 8I, 8J and 8K show a sequential manufacturing operation for an SOT-STT hybrid MRAM device according to the present disclosure.

As shown in FIG. 8A, a hard mask structure 220 is formed over a n-th wiring layer including a metal wiring 210 embedded in an interlayer dielectric (ILD) layer 200. In some embodiments, n is 4, 5 or 6. In some embodiments, the metal wiring 210 is made of Cu or a Cu alloy. In some embodiments, the hard mask layer 220 includes a first layer 222, a second layer 224 and a third layer 226. In some embodiments, the first to third layers are made of one of silicon oxide, silicon nitride, SiC, SiCN, aluminum oxide, zirconium oxide or any other suitable dielectric material. In certain embodiments, the first and third layers 222 and 226 are made of SiC and the second layer 224 is made of silicon oxide.

Then, the hard mask layer 220 is patterned to form an opening, so as to at least partially expose the upper surface of the metal wiring 210 by using one or more lithography and etching operations. A liner layer 230 is formed in the opening and a conductive layer 240 is formed over the liner layer 230, as shown in FIG. 8B. In some embodiments, the liner layer 230 is made of Ti, Ta or TaN and the conductive layer 240 is made TiN. After the conductive layer 240 is formed, a planarization operation, such as chemical mechanical polishing (CMP), is performed to form an electrode 240, as shown in FIG. 8C. The electrode 240 corresponds to the bottom electrode via BEVA shown in FIG. 4 in some embodiments.

Figure 8D:
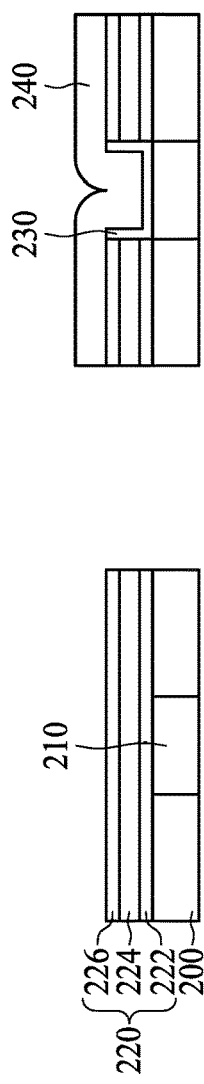
Figures 8B, 8C, 8E:
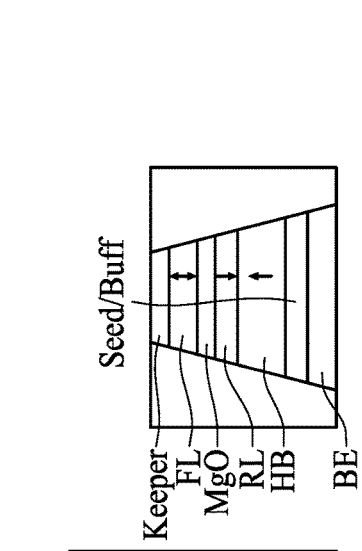

Subsequently, layers for the MTJ film stack is formed over the electrode 240 as shown in FIG. 8D. In FIGS. 8D-8K, the electrode 240, the metal wiring 210 and the ILD layer 200 are omitted. The layer for the MTJ film stack includes layers for a bottom electrode BE, a seed or buffer layer Seed/Buff, a hard bias layer HB, a reference layer RL, an MgO layer MgO, a free layer FL, a keeper layer Keeper, a CMP stop layer and a hard mask layer HM, in some embodiments. Each of the layers of the MTJ film stack can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further comprising low pressure CVD (LPCVD), ultrahigh vacuum CVD (UHVCVD), reduced pressure CVD (RPCVD); electro plating, or any combinations thereof.

Figure 8F:
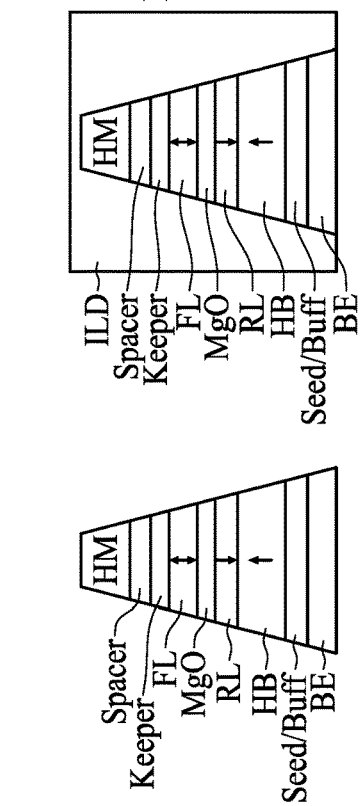
Figure 8K:
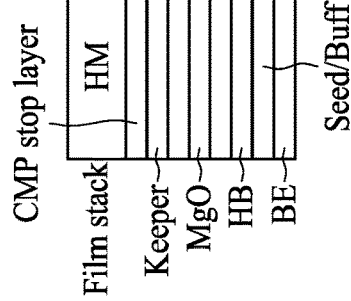
Figures 8G, 8H:
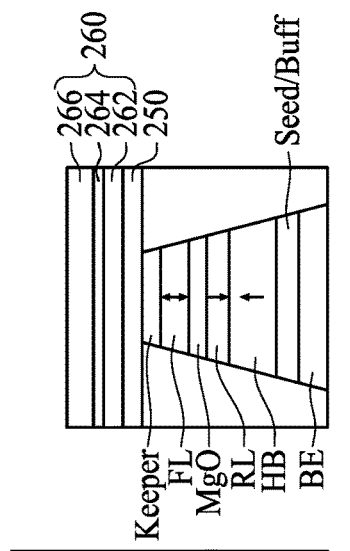

Then, the stacked layers for the MTJ film are patterned into an MTJ film stack by using one or more lithography and etching operations, as shown in FIG. 8E. In some embodiments, as shown in FIG. 8E, the cross sectional view of the MTJ film stack has a tapered (mesa) shape. Then, one or more dielectric material layers ILD, such as silicon oxide, SiOC, SiOCN, SiCN, are formed to fully cover the MTJ film stack, as shown in FIG. 8F. A planarization operation, such as CMP, is performed to expose the uppermost layer of the MTJ film stack, as shown in FIG. 8G. Then, a conductive layer 250 for the SOT induction wiring layer 10 and conductive layers 260 for the top conductive layer 5 (see, FIG. 1) are formed as shown in FIG. 8H. In some embodiments, the conductive layers 260 includes a first conductive layer 262, a second conductive layer 264 as an etching stop layer and a third conductive layer 266. The second conductive layer 264 is made of a different material than the first and the third conductive layers. In some embodiments, no first conductive layer is formed.

Figure 8I:
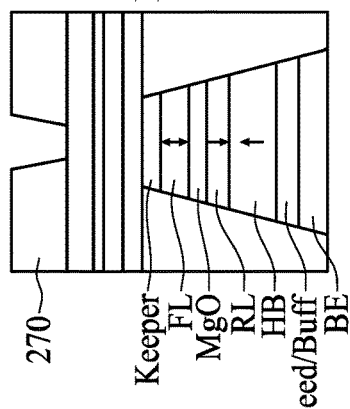
Figure 8J:
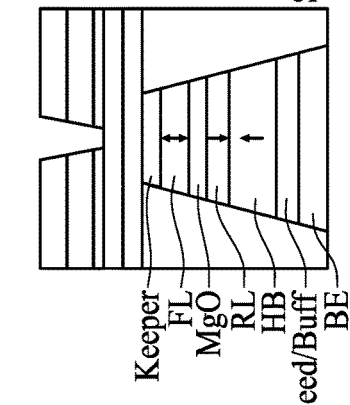

Further, as shown in FIG. 8I, a photo resist pattern 270 is formed over the conductive layers 260, and the conductive layers 260 are patterned by using one or more lithography and etching operations, as shown in FIG. 8J. Then, the photo resist pattern 270 is removed as shown in FIG. 8K so as to obtain the structure shown in FIG. 5A. In some embodiments, the etching stops at the second conductive layer 264. In other embodiments, an additional etching is performed so that the first conductive layer is partially etched. In some embodiments, before or after the patterning operations shown in FIGS. 8I-8K, the conductive layers 250 and 260 are patterned to form a line shaped pattern, and the thickness of the conductive layers 260 is reduced by the operations of FIGS. 8I-8K.

Figure 9A:
FIGS. 9A, 9B and 9C show various structures for an SOT induction wiring layer according to embodiments of the present disclosure.
Figure 9B:
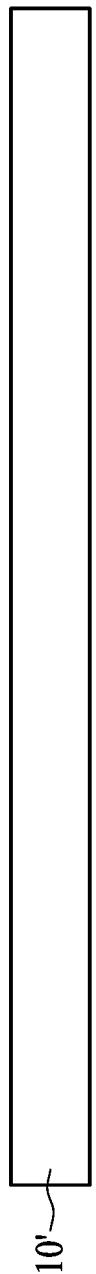
Figure 9C:

FIGS. 9A-9C shows various structures for the SOT induction wiring layer. In some embodiments, the SOT induction wiring layer 10 is a single layer of heavy metal, such as W, Ta and Mo, as shown in FIG. 9A. In other embodiments, the SOT induction wiring layer 10' is a single layer of antiferromagnetic material, such as IrMn, as shown in FIG. 9B. In other embodiments, the SOT induction wiring layer 10" is a bi-layer of heavy metal layer 11 and an antiferromagnetic material layer 12, where the heavy metal layer 11 is in contact with the MTJ film stack, as shown in FIG. 9C.

It will be understood that not all advantages have been necessarily discussed herein, no particular advantage is required for all embodiments or examples, and other embodiments or examples may offer different advantages.

In accordance with one aspect of the present disclosure, a magnetic memory including a first spin-orbital-transfer-spin-torque-transfer (SOT-STT) hybrid magnetic device disposed over a substrate, a second SOT-STT hybrid magnetic device disposed over the substrate, and a SOT conductive layer connected to the first and second SOT-STT devices. Each of the first and second SOT-STT hybrid magnetic devices includes a first magnetic layer, as a magnetic free layer, a spacer layer disposed under the first magnetic layer, and a second magnetic layer, as a magnetic reference layer, disposed under the spacer layer. The SOT conductive layer is disposed over the first magnetic layer of each of the first and second SOT-STT hybrid magnetic devices. In one or more of the foregoing and following embodiments, the SOT conductive layer includes one or more layers of W, Ta, Mo and IrMn. In one or more of the foregoing and following embodiments, the SOT conductive layer includes a bottom layer made of W, Ta or Mo, and a top layer made of IrMn. In one or more of the foregoing and following embodiments, the magnetic memory further includes an upper electrode layer disposed in contact with the SOT conductive layer. In one or more of the foregoing and following embodiments, the upper electrode layer includes a narrow portion having a width narrower than a remaining portion or a thin portion having a thickness smaller than the remaining portion over each of the first and second SOT-STT hybrid magnetic devices, and the remaining portion is disposed between the first SOT-STT hybrid magnetic devices and the second SOT-STT hybrid magnetic device. In one or more of the foregoing and following embodiments, each of the first and second SOT-STT hybrid magnetic devices further comprises an interfacial layer disposed over the first magnetic layer and in contact with the SOT conductive layer. In one or more of the foregoing and following embodiments, the first magnetic layer is $Fe_xCo_yB_{1-x-y}$, $0.50 \leq x \leq 0.70$ and $0.10 \leq y \leq 0.30$. In one or more of the foregoing and following embodiments, the second magnetic layer includes at least one of a layer of Co, Fe and B, and a layer of Fe and B. In one or more of the foregoing and following embodiments, each of the first and second SOT-STT hybrid magnetic devices further comprises a third magnetic layer, as a bias layer, under the second magnetic layer, and the third magnetic layer includes a layer of Co and Fe. In one or more of the foregoing and following embodiments, each of the first and second SOT-STT hybrid magnetic devices further comprises a bottom electrode layer disposed under the third magnetic layer. In one or more of the foregoing and following embodiments, each of the first and second SOT-STT hybrid magnetic devices further comprises a STT switching device, one terminal of the STT switching device is coupled to the bottom electrode and another terminal of the switching device is coupled to a source line, the magnetic memory further comprises an SOT switching device, and one terminal of the SOT switching device is coupled to the SOT conductive layer and another terminal of the SOT switching device is coupled to the source line. In one or more of the foregoing and following embodiments, the source line is coupled to a current source. In one or more of the foregoing and following embodiments, the STT switching device and the SOT switching device are located below the first and second SOT-STT hybrid magnetic devices.

In accordance with another aspect of the present disclosure, a magnetic memory includes first word lines, a second word line, a bit line, a source line, memory cells, and a conductive wire. Each of the memory cells includes a magnetic-tunneling-junction (MTJ) film stack and a spin-torque-transfer (STT) switching device. One terminal of the STT switching device is coupled to one end of the MTJ film stack, another terminal of the STT switching device is coupled to the source line and a control terminal of the STT switching device is coupled to corresponding one of the first word lines. Another end of the MTJ film stack is coupled to the conductive wire. The conductive wire is coupled to the bit line. The magnetic memory further comprises a SOT switching device. One terminal of the SOT switching device is coupled to the conductive wire, another terminal of the SOT switching device is coupled to the source line and a control terminal of the SOT switching device is coupled to the second word line. In one or more of the foregoing and following embodiments, the source line is coupled to a current source. In one or more of the foregoing and following embodiments, a number of the memory cells coupled to the conductive wire is in a range from 2 to 32. In one or more of the foregoing and following embodiments, the MTJ film stack includes a first magnetic layer, as a magnetic free layer, a spacer layer disposed under the first magnetic layer, and a second magnetic layer, as a magnetic reference layer, disposed under the spacer layer. The conductive wire is disposed over the first magnetic layer. In one or more of the foregoing and following embodiments, the magnetic memory further includes driver circuitry configured to apply a SOT current to the conductive wire by turning on the SOT switching device, and thereafter, apply a STT current to one of the memory cells by turning on the STT switching device coupled to the one of the memory cells, thereby writing data to the one of the memory cells. In one or more of the foregoing and following embodiments, the driver circuitry configured to turn off the STT switching device coupled to the one of the memory cells, and thereafter turn off the SOT switching device.

In accordance with another aspect of the present disclosure, in a method of manufacturing a magnetic memory, a plurality of magnetic-tunneling-junction (MTJ) film stacks are formed. Each of the plurality of MTJ film stacks includes a first magnetic layer, as a magnetic free layer, a spacer layer disposed under the first magnetic layer, and a second magnetic layer, as a magnetic reference layer, disposed under the spacer layer. An interlayer dielectric layer is formed to isolate the plurality of MTJ film stacks from each other. A conductive wire is formed over the plurality of MTJ film stacks to be coupled to the plurality of cell stacks. The conductive wire includes a narrow portion having a width narrower than a remaining portion or a thin portion having a thickness smaller than the remaining portion over each of the plurality of MTJ film stacks, the remaining portion being disposed between adjacent MTJ film stacks. In one or more of the foregoing and following embodiments, the conductive wire includes a bottom layer including one or more layers of W, Ta, Mo and IrMn and a top layer made of one or more of TiN, Ru Ti, TaN and Al, and the method further comprises trimming a part of the top layer located over each of the plurality of MTJ film stacks.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic memory, comprising:
   a first spin-orbital-transfer-spin-torque-transfer (SOT-STT) hybrid magnetic device disposed over a substrate;
   a second SOT-STT hybrid magnetic device disposed over the substrate; and
   a SOT conductive layer connected to the first and second SOT-STT hybrid magnetic devices, wherein:
   each of the first and second SOT-STT hybrid magnetic devices comprises:
      a first magnetic layer, as a magnetic free layer;
      a spacer layer disposed under the first magnetic layer; and
      a second magnetic layer, as a magnetic reference layer, disposed under the spacer layer, and
   the SOT conductive layer is disposed over the first magnetic layer of each of the first and second SOT-STT hybrid magnetic devices.

2. The magnetic memory of claim 1, wherein the SOT conductive layer includes one or more layers of W, Ta, Mo and IrMn.

3. The magnetic memory of claim 1, wherein the SOT conductive layer includes a bottom layer made of W, Ta or Mo, and a top layer made of IrMn.

4. The magnetic memory of claim 1, further comprising an upper electrode layer disposed in contact with the SOT conductive layer.

5. The magnetic memory of claim 4, wherein the upper electrode layer includes a narrow portion having a width narrower than a remaining portion or a thin portion having a thickness smaller than the remaining portion over each of the first and second SOT-STT hybrid magnetic devices, the remaining portion being disposed between the first SOT-STT hybrid magnetic device and the second SOT-STT hybrid magnetic device.

6. The magnetic memory of claim 1, wherein each of the first and second SOT-STT hybrid magnetic devices further comprises an interfacial layer disposed over the first magnetic layer and in contact with the SOT conductive layer.

7. The magnetic memory of claim 1, wherein the first magnetic layer is $Fe_xCo_yB_{1-x-y}$, $0.50 \leq x \leq 0.70$ and $0.10 \leq y \leq 0.30$.

8. The magnetic memory of claim 7, wherein the second magnetic layer includes at least one of a layer of Co, Fe and B, and a layer of Fe and B.

9. The magnetic memory of claim 8, wherein:
each of the first and second SOT-STT hybrid magnetic devices further comprises a third magnetic layer, as a bias layer, under the second magnetic layer, and
the third magnetic layer includes a layer of Co and Fe.

10. The magnetic memory of claim 9, wherein each of the first and second SOT-STT hybrid magnetic devices further comprises a bottom electrode layer disposed under the third magnetic layer.

11. The magnetic memory of claim 10, wherein:
each of the first and second SOT-STT hybrid magnetic devices further comprises a STT switching device,
one terminal of the STT switching device is coupled to the bottom electrode and another terminal of the switching device is coupled to a source line,
the magnetic memory further comprises an SOT switching device, and
one terminal of the SOT switching device is coupled to the SOT conductive layer and another terminal of the SOT switching device is coupled to the source line.

12. The magnetic memory of claim 11, wherein the source line is coupled to a current source.

13. The magnetic memory of claim 11, wherein the STT switching device and the SOT switching device are located below the first and second SOT-STT hybrid magnetic devices.

14. A magnetic memory, comprising:
a plurality of spin-orbital-transfer-spin-torque-transfer (SOT-STT) hybrid magnetic devices disposed over a substrate; and
a SOT conductive layer connected to the plurality of SOT-STT hybrid magnetic devices, wherein:
each of the plurality of SOT-STT hybrid magnetic devices comprises:
a first magnetic layer, as a magnetic free layer;
a spacer layer disposed under the first magnetic layer; and
a second magnetic layer, as a magnetic reference layer, disposed under the spacer layer, and
a number of the plurality of SOT-STT hybrid magnetic devices coupled to the conductive wire is 4 or more.

15. The magnetic memory of claim 14, wherein the SOT conductive layer includes IrMn.

16. The magnetic memory of claim 14, wherein the SOT conductive layer includes a bottom layer made of W, Ta or Mo, and a top layer made of IrMn.

17. The magnetic memory of claim 14, further comprising an upper electrode layer disposed in contact with the SOT conductive layer,
wherein the upper electrode layer includes a narrow portion having a width narrower than a remaining portion or a thin portion having a thickness smaller than the remaining portion over each of the plurality of SOT-STT hybrid magnetic devices, the remaining portion being disposed between adjacent two SOT-STT hybrid magnetic devices.

18. A magnetic memory, comprising:
a plurality of spin-orbital-transfer-spin-torque-transfer (SOT-STT) hybrid magnetic devices disposed over a substrate;
a plurality of first switching devices coupled to the plurality of SOT-STT hybrid magnetic devices, respectively;
a SOT conductive layer connected to the plurality of SOT-STT hybrid magnetic devices; and
a second switch coupled to the SOT conductive layer, wherein:
each of the plurality of SOT-STT hybrid magnetic devices comprises:
a first magnetic layer, as a magnetic free layer;
a spacer layer disposed under the first magnetic layer; and
a second magnetic layer, as a magnetic reference layer, disposed under the spacer layer, and
the SOT conductive layer is disposed over the first magnetic layer of each of the first and second SOT-STT hybrid magnetic devices.

19. The magnetic memory of claim 18, further comprising:
first word lines;
a second word line;
a bit line; and
a source line, wherein:
one terminal of each of the plurality of first switching devices is coupled to one end of each of the plurality of SOT-STT hybrid magnetic devices, respectively, and another terminal of each of the plurality of first switching devices is coupled to the source line and a control terminal of each of the plurality of first switching devices is coupled to corresponding one of the first word lines,
another end of each of the plurality of SOT-STT hybrid magnetic devices is coupled to the conductive wire, and
the conductive wire is coupled to the bit line.

20. The magnetic memory of claim 18, further comprising driver circuitry configured to:
apply a SOT current to the conductive wire by turning on the second switching device; and
thereafter, apply a STT current to one of the plurality of SOT-STT hybrid magnetic devices by turning on a corresponding one of the plurality of first switching devices, thereby writing data.

* * * * *